United States Patent
Ning et al.

(10) Patent No.: US 7,335,566 B2
(45) Date of Patent: Feb. 26, 2008

(54) POLYSILICON GATE DOPING METHOD AND STRUCTURE FOR STRAINED SILICON MOS TRANSISTORS

(75) Inventors: Xian J. Ning, Shanghai (CN); Bei Zhu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/548,280

(22) Filed: Oct. 10, 2006

(65) Prior Publication Data

US 2007/0184668 A1 Aug. 9, 2007

(30) Foreign Application Priority Data

Oct. 31, 2005 (CN) .................. 2005 1 0110069

(51) Int. Cl.
*H01L 21/336* (2006.01)
(52) U.S. Cl. ............... 438/300; 438/303; 257/368; 257/E21.619
(58) Field of Classification Search ............ 438/300, 438/303; 257/369, E21.619
See application file for complete search history.

(56) References Cited

U.S. PATENT DOCUMENTS

| | | | | |
|---|---|---|---|---|
| 6,048,756 A * | 4/2000 | Lee et al. | ................ | 438/151 |
| 6,274,894 B1 * | 8/2001 | Wieczorek et al. | ......... | 257/192 |
| 6,495,402 B1 * | 12/2002 | Yu et al. | .................... | 438/149 |
| 6,703,648 B1 * | 3/2004 | Xiang et al. | ................ | 257/192 |
| 6,787,852 B1 * | 9/2004 | Yu et al. | .................... | 257/347 |
| 6,861,318 B2 * | 3/2005 | Murthy et al. | ............. | 438/299 |
| 6,960,781 B2 * | 11/2005 | Currie et al. | ................ | 257/19 |
| 7,037,793 B2 * | 5/2006 | Chien et al. | ................ | 438/300 |
| 2005/0093075 A1 * | 5/2005 | Bentum et al. | ............ | 257/368 |

* cited by examiner

Primary Examiner—Steven Loke
Assistant Examiner—Earl Taylor
(74) Attorney, Agent, or Firm—Townsend and Townsend and Crew LLP

(57) ABSTRACT

A method of fabricating an integrated circuit including strained silicon bearing regions. The method forms a blanket layer of material having an initial thickness overlying a source region, a drain region, and a gate structure of an MOS device to cover an upper surface of the gate structure, including the hard mask layer, to form a substantially planarized surface region from the blanket layer. The method removes a portion of the initial thickness of the blanket layer to remove the hard mask and expose a portion of the gate structure. In a preferred embodiment, the portion of the gate structure is substantially polysilicon material. The method introduces dopant impurities into the portion of the gate structure using at least an implantation process to dope the gate structure, while maintaining the source region and the drain region free from the dopant impurities.

20 Claims, 7 Drawing Sheets

US 7,335,566 B2

POLYSILICON GATE DOPING METHOD AND STRUCTURE FOR STRAINED SILICON MOS TRANSISTORS

CROSS-REFERENCES TO RELATED APPLICATIONS

The present application claims priority to Chinese Patent Application Serial No. 200510110069.0, filed on Oct. 31, 2005, commonly assigned, and hereby incorporated by reference for all purposes.

The present application relates to U.S. Ser. No. 11/244,955 (SMIC Reference No.: I-04-160), commonly assigned, and hereby incorporated by reference for all purposes.

BACKGROUND OF THE INVENTION

The present invention is directed to integrated circuits and their processing for the manufacture of semiconductor devices. More particularly, the invention provides a method and structures for doping polysilicon gate structures in the manufacture of MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for doping polysilicon gate structures in the manufacture of MOS devices using strained silicon structures for advanced CMOS integrated circuit devices. But it would be recognized that the invention has a much broader range of applicability.

As further background information, integrated circuit processes often involves gate patterning, which is normally using poly crystalline silicon as a gate conductor. A polysilicon film is often deposited on the substrate, which is single crystal silicon that has undergone various processes such as implantations, gate oxide formation. The polysilicon is then covered with dielectric materials such as silicon oxide and/or silicon oxynitride. The dielectric film is then photo lithographically patterned and etched to form the gate conductor pattern. The patterned dielectric materials is then used as "hard mask" to transfer the pattern into polysilicon using a plasma etch or like process. The hard mask is stripped by wet chemicals after polysilicon patterning.

As critical dimensions become smaller, silicon germanium ("SiGe") as source and drain regions of a PMOS transistor for integrated circuits have been used by selective growth of epitaxal films in designed area of silicon substrate. Prior to the SiGe film growth, a silicon etch is applied to recess the silicon surface to form a recess for the SiGe to grow. The hard mask for polysilicon patterning mentioned above will then be used for the self-aligned mask for the recess etch. The hard mask will then have to be removed after in-situ doped SiGe growth in order to have silicide formation on top of the polysilicon gate structure. We discovered certain limitations associated with one or more of these processes used to manufacture the PMOS transistors. The dielectric hard mask remove process undesirably erodes the poly gate spacer that was formed after poly gate pattern as well as the shallow trench isolation (STI). Also, a polysilicon gate often needs to be doped by ion-implantation, which may cause impurities into other portions of the PMOS device. As will be fully described below, the present invention provides a method for an integration scheme that removes the hard mask of poly and self-aligned for poly doping, among other features.

In a specific embodiment, the present invention provides a method for forming a semiconductor integrated circuit device, e.g., MOS, CMOS. The method includes providing a semiconductor substrate, e.g., silicon substrate, silicon on insulator, epitaxial silicon substrate. The method includes forming a dielectric layer (e.g., silicon dioxide, silicon nitride, silicon oxynitride) overlying the semiconductor substrate. The method includes forming a gate layer (e.g., polysilicon) overlying the dielectric layer. In a preferred embodiment, the gate layer is overlying a channel region in the semiconductor substrate. The method includes forming a hard mask (e.g., silicon dioxide, silicon nitride) overlying the gate layer. The method includes patterning the gate layer, including the hard mask layer, to form a gate structure including edges, while a portion of the hard mask layer remains on the gate structure. The method includes forming a dielectric layer (e.g., conformal thickness) overlying the gate structure and hard mask layer to protect the gate structure including the edges. The method patterns the dielectric layer to form sidewall spacer structures on the gate structure, including the edges, while the hard mask layer remains on the gate structure. The method etches a source region and a drain region adjacent to the gate structure using the dielectric layer and portion of the hard mask layer as a protective layer. The method deposits silicon germanium material (e.g., epitaxial) into the source region and the drain region to fill the etched source region and the etched drain region to cause a channel region between the source region and the drain region to be strained in compressive mode from at least the silicon germanium material formed in the source region and the drain region.

In a preferred embodiment, the method forms a blanket layer of material having an initial thickness overlying the source region, the drain region, and the gate structure to cover an upper surface of the gate structure, including the hard mask layer, to form a substantially planarized surface region from the blanket layer. The method removes a portion of the initial thickness of the blanket layer to remove the hard mask and expose a portion of the gate structure. In a preferred embodiment, the portion of the gate structure is substantially polysilicon material. The method introduces dopant impurities into the portion of the gate structure using at least an implantation process to dope the gate structure, while maintaining the source region and the drain region free from the dopant impurities.

Depending upon the embodiment, one or more of these features may exist.

1. Self-aligned polysilicon hard mask removal by applying planarized material and then removed by plasma etching to expose the hard masks on top of polysilicon (Removing the hard mask before a silicide process has been difficult to perform);
2. To remove the polysilicon hard mask by plasma etch or other selective process;
3. To remove the hard mask by wet strip and/or other selective process;
4. To dope impurities into the polysilicon gate structure by self-aligned implantation using the BARC and photoresist layers as a protective layer; and
5. To dope polysilicon gates in the CMOS devices using one or two mask levels for in-situ doped source and drain epitaxial structures.

Depending upon the embodiment, one or more of these features can exist. Of course, there can be other variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. In a preferred embodiment, the present invention provides an improved polysilicon gate structure that has improved doping properties. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for doping polysilicon gate structures in the manufacture of MOS devices using strained silicon structures for advanced CMOS integrated circuit devices. But it would be recognized that the invention has a much broader range of applicability.

Figure 1:
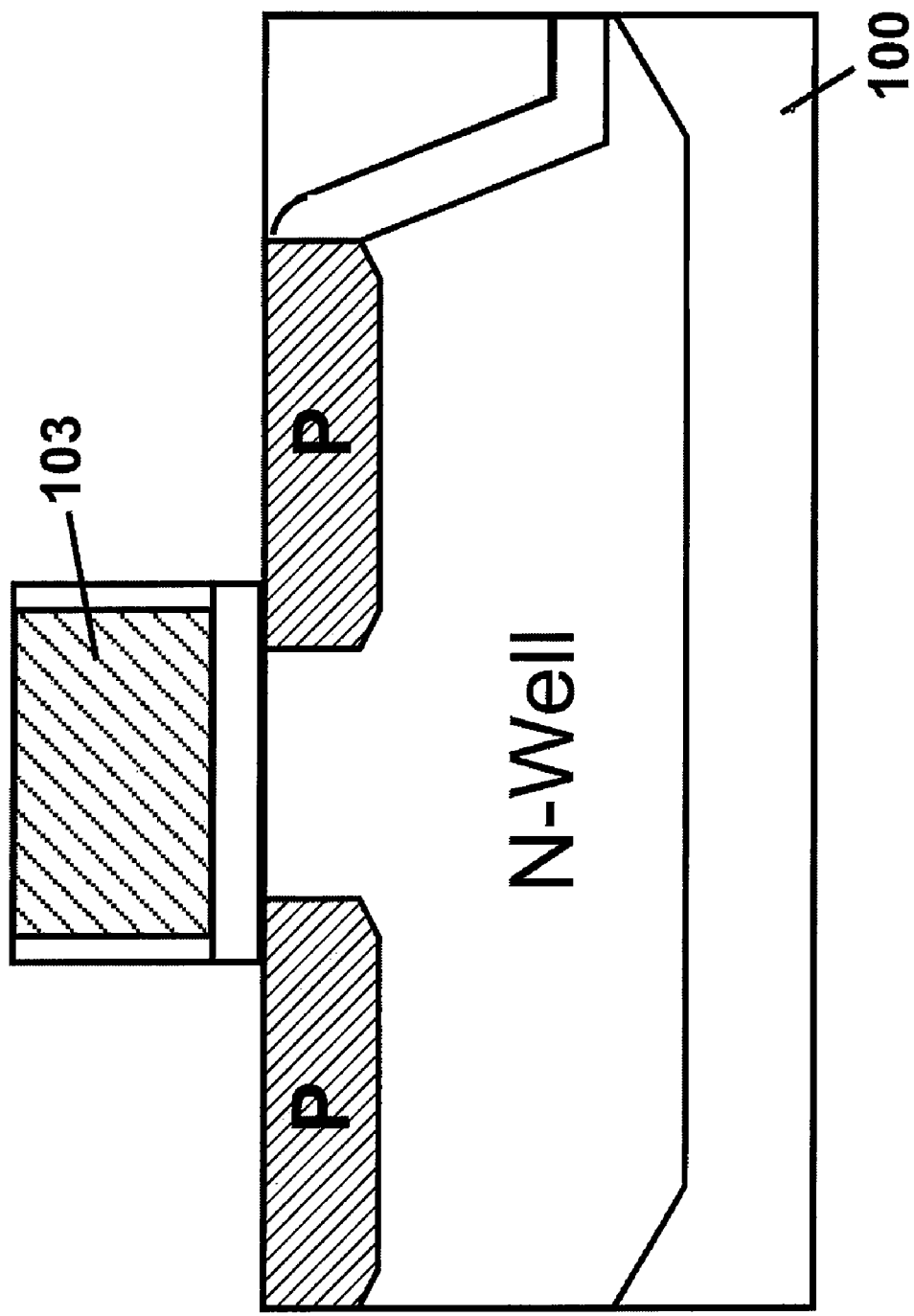
FIGS. 1 through 3 are simplified cross-sectional view diagrams illustrating a conventional method for fabricating a strained silicon MOS device.
Figure 2:
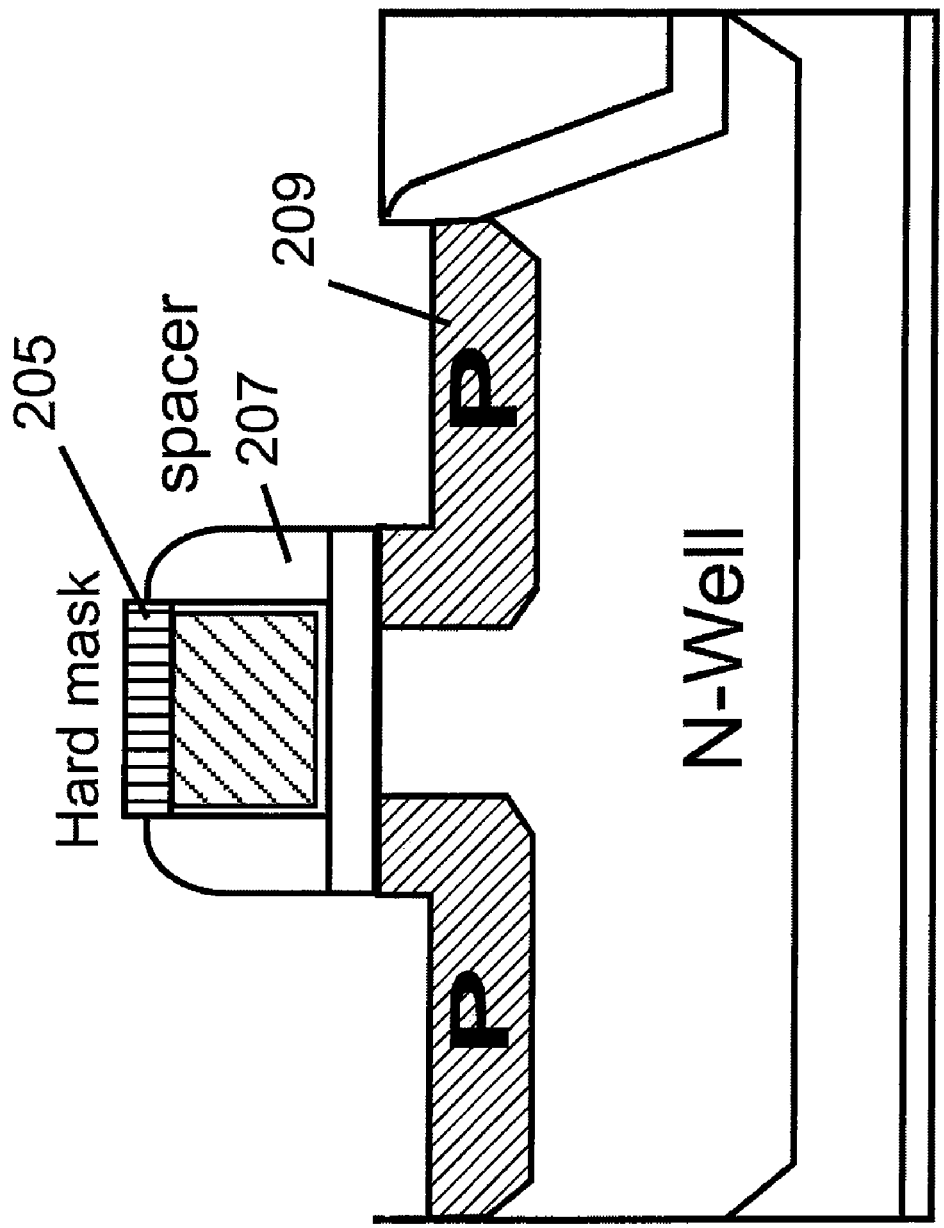
Figure 3:
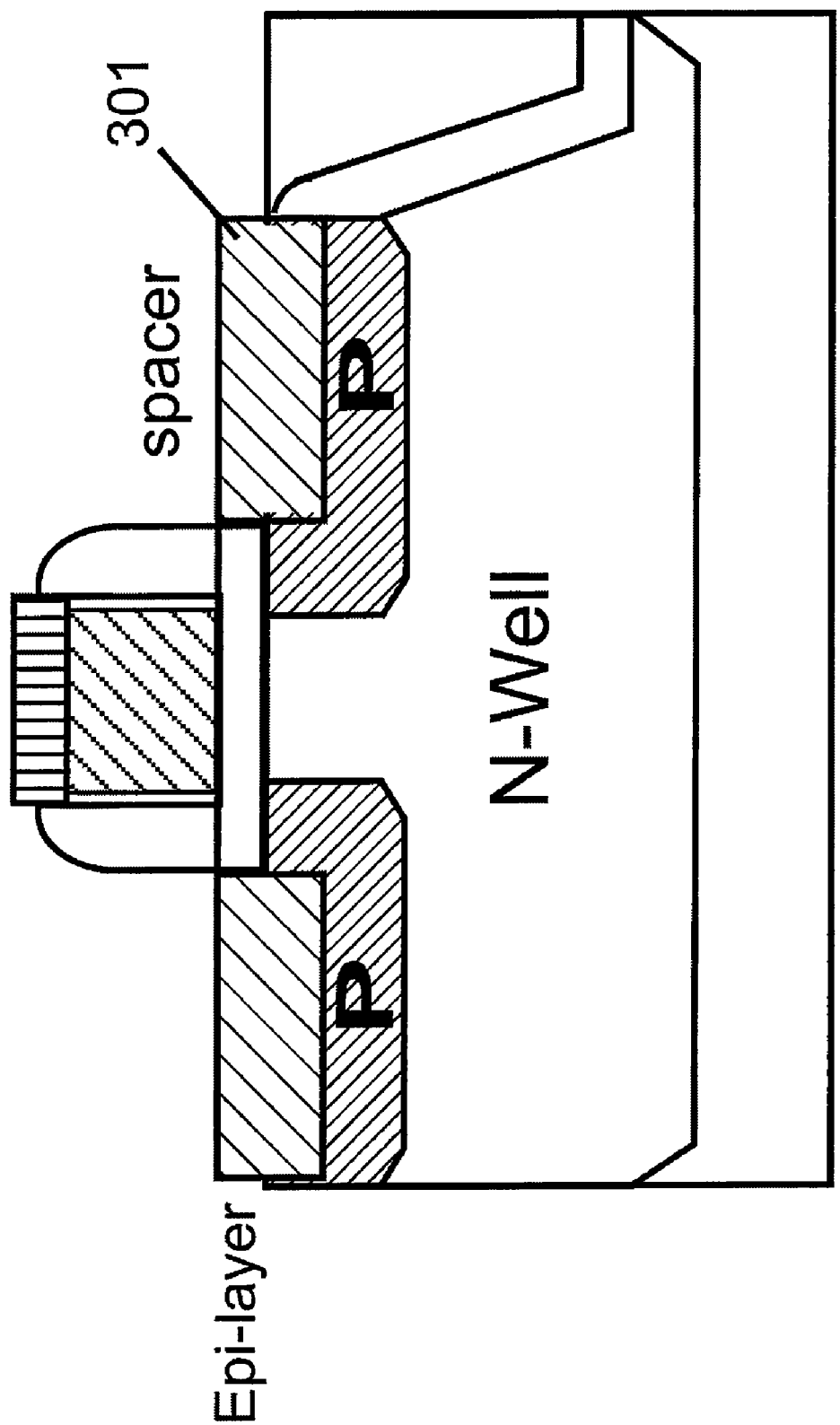

FIGS. 1 through 3 are simplified cross-sectional view diagram of conventional methods for fabricating a strained silicon MOS device. Referring to FIGS. 1 through 3, a conventional process sequence has been reproduced below.

1. Provide a silicon substrate (100);
2. Form gate layer (103);
3. Form dielectric hard mask (205);
4. Pattern dielectric mask;
5. Pattern gate layer to form polysilicon gates;
6. Deposit spacer layer and etch back to form spacer structures 207;
7. Etch source/drain recessed regions 209 in silicon;
8. Form epitaxial silicon/germanium 301 in recessed regions;
9. Remove hard mask; and
10. Perform other steps as desired.

As noted above, the hard mask is often difficult to remove accurately and can degrade the silicon/germanium source and drain regions. Additionally, the spacers also degrade during the etching of the recessed regions. After formation of the source/drain regions, the hardmask must often be removed for subsequent contact formation. Limitations exist with the conventional hard mask. Added resistivity may exist from any remaining dielectric residues on the gate layer. Additionally, residual silicon/germanium may deposit on any exposed surfaces of the gate layer, depending upon the quality of the hard mask. When implanting the polysilicon gate structure, impurities may also be introduced into other regions of the device that are undesirable. These and other limitations may be overcome by the present method and structures, which will be described in more detail below.

Figure 4:
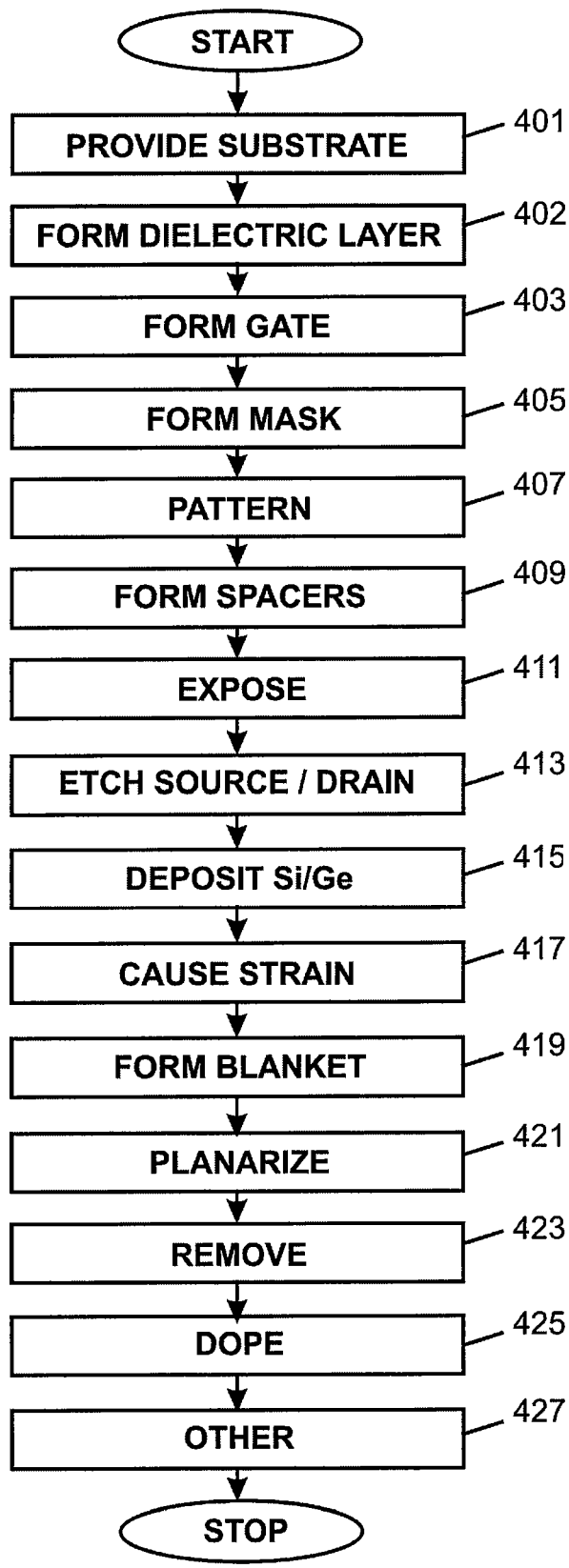
FIG. 4 is a simplified flow diagram illustrating a method for forming a strained silicon device according to an embodiment of the present invention.

A method 400 for fabricating an integrated circuit device according to an embodiment of the present invention may be outlined as follows (see FIG. 4):

1. Provide a semiconductor substrate (step 401), e.g., silicon wafer, silicon on insulator;
2. Form a dielectric layer (e.g., gate oxide or nitride) (step 402) overlying the semiconductor substrate;
3. Form a gate layer (step 403) (e.g., polysilicon, metal) overlying the dielectric layer;
4. Form a hard mask layer (step 405) overlying the dielectric layer;
5. Pattern the gate layer (step 407), including the hard mask layer, to form a gate structure including edges (e.g., a plurality of sides or edges);
6. Form a dielectric layer overlying the gate structure to protect the gate structure including the edges;
7. Pattern the dielectric layer to form sidewall spacers (step 409) on edges of the gate structure;

8. Optionally, expose (step 411) a portion of the hard mask layer during the pattern of the dielectric layer;
9. Etch the source region and the drain region (step 413) adjacent to the gate structure using the dielectric layer and the hard mask as the protective layer;
10. Deposit silicon germanium material (step 415) into the source region and the drain region to fill the etched source region and the etched drain region;
11. Cause a channel region between the source region and the drain region to be strained (step 417) in compressive mode from at least the silicon germanium material formed in the source region and the drain region, wherein the channel region is about the same width as the patterned gate layer;
12. Form (step 419) a blanket layer of material having an initial thickness overlying the source region, the drain region, and the gate structure to cover an upper surface of the gate structure, including the hard mask layer;
13. Form a substantially planarized surface region (step 421) from the blanket layer;
14. Remove (step 423) a portion of the initial thickness of the blanket layer to remove the hard mask and expose a portion of the gate structure, which is substantially polysilicon material;
15. Introduce (step 425) dopant impurities into the portion of the gate structure using at least an implantation process to dope the gate structure, while maintaining the source region and the drain region free from the dopant impurities; and
16. Perform other steps (step 427), as desired.

The above sequence of steps provides a method according to an embodiment of the present invention. As shown, the method uses a combination of steps including a way of forming an integrated circuit device such as an MOS device for a CMOS integrated circuit. As shown, the method includes a way of removing the hard mask layer without damaging other portions of the MOS device according to a specific embodiment. Additionally, the method also uses a blanket layer to protect source/drain regions from damage and/or impurities according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 5:
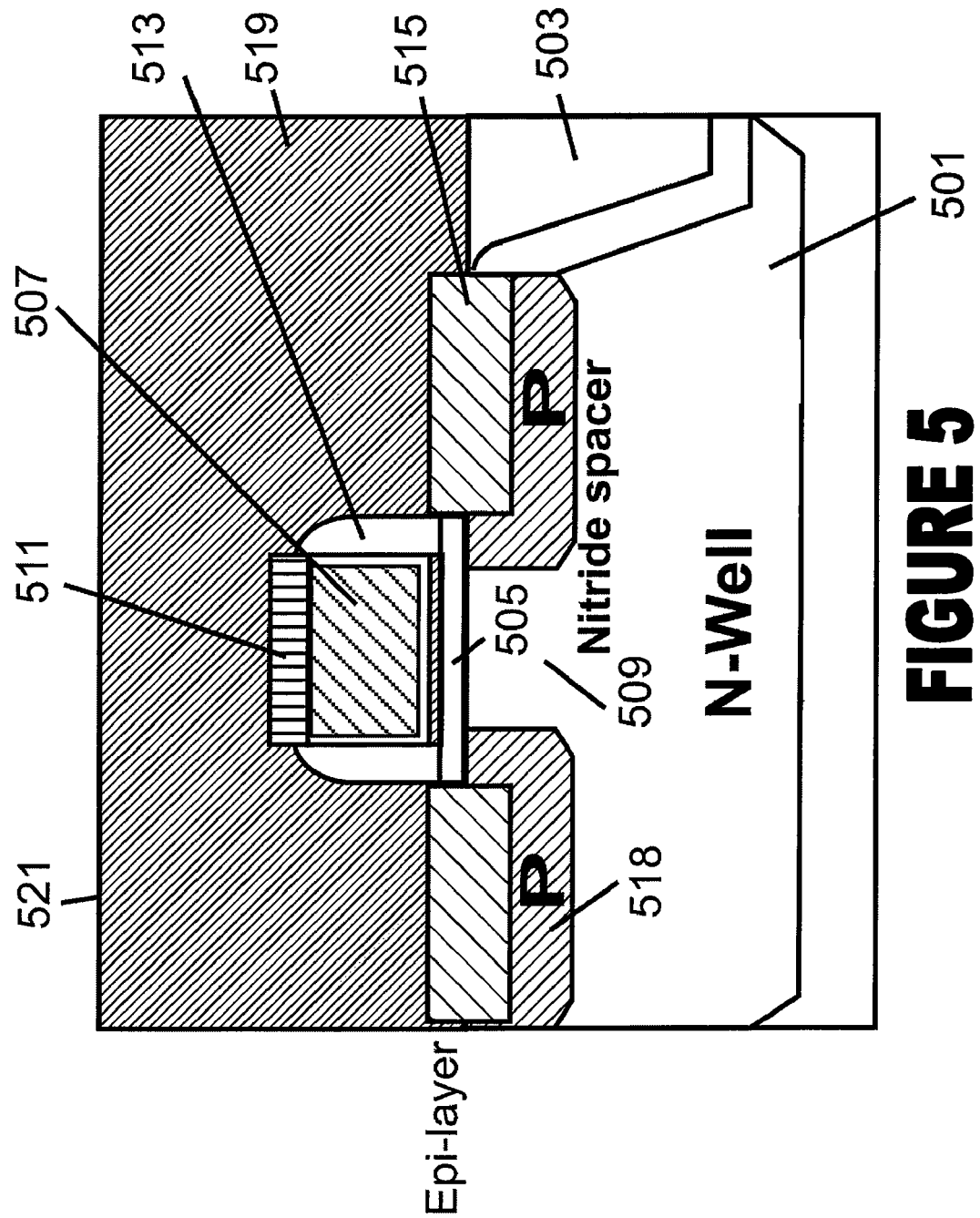
FIGS. 5 through 7 are simplified cross-sectional view diagrams illustrating a method for fabricating a strained silicon MOS device according to an embodiment of the present invention.
Figure 6:
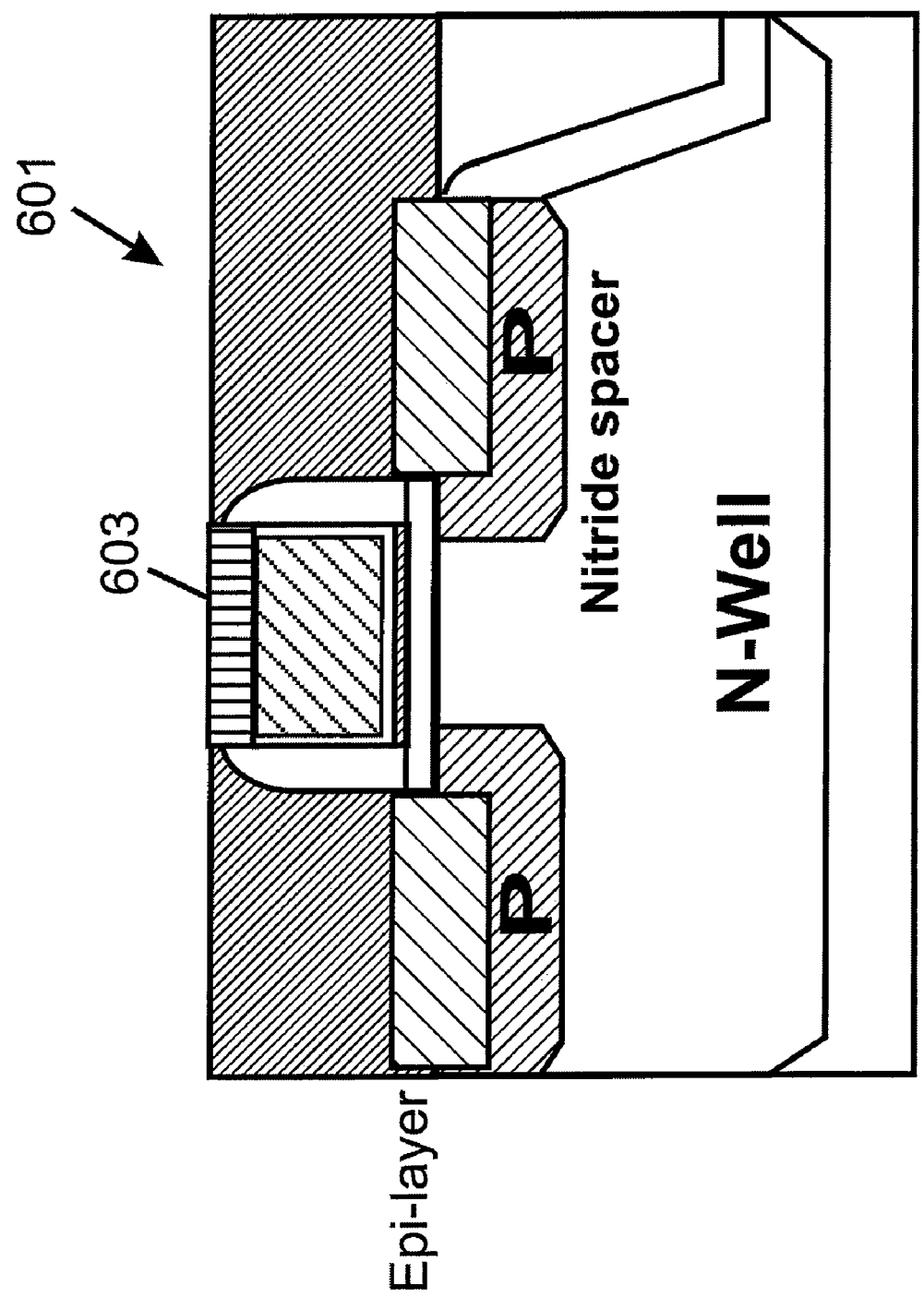
Figure 7:
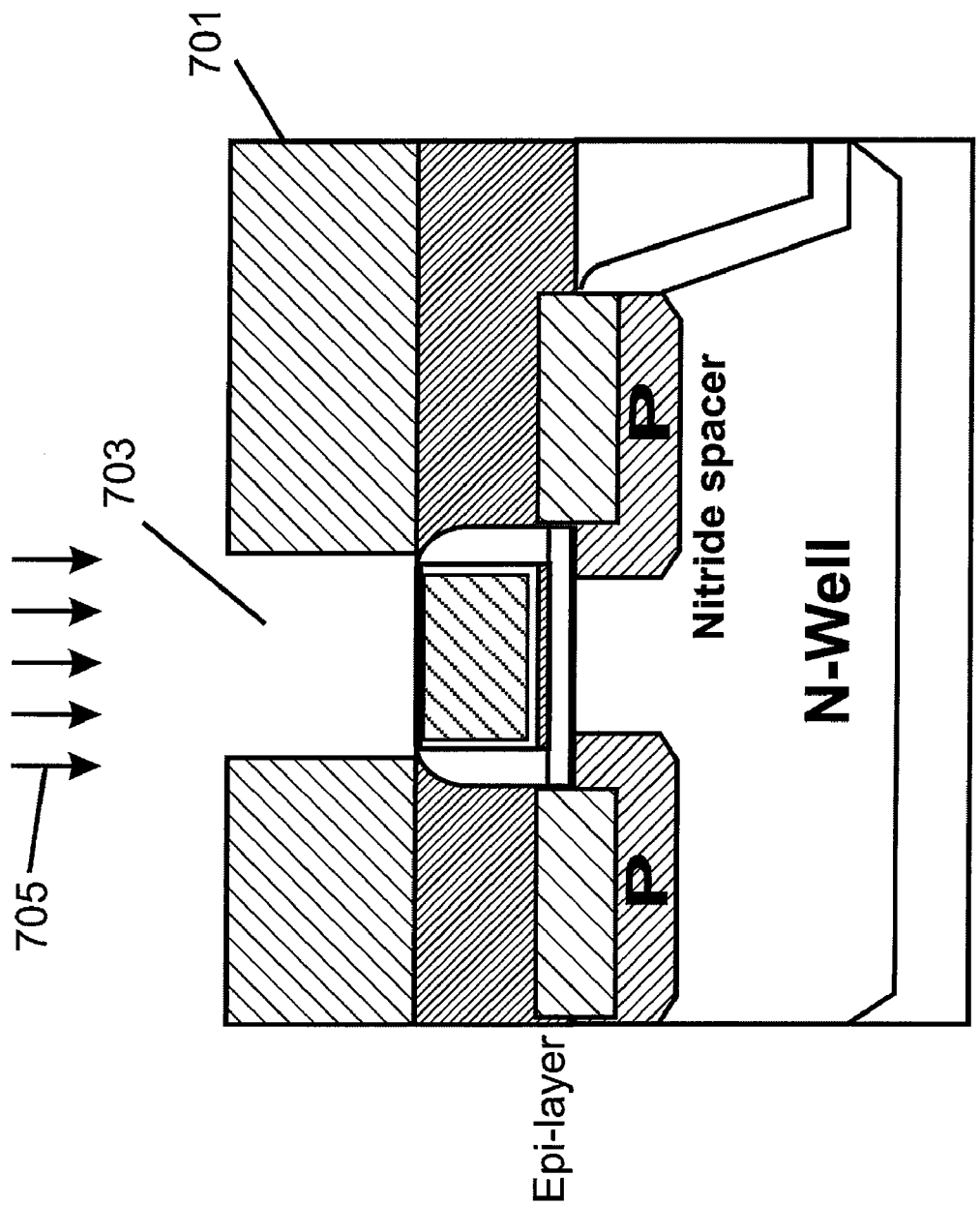

FIGS. 5 through 7 are simplified cross-sectional view diagrams illustrating a method for fabricating a strained silicon MOS device according to an embodiment of the present invention. These diagrams are merely examples, which should not unduly limit the scope of the claims herein. One of ordinary skill in the art would recognize many variations, alternatives, and modifications. As shown, the present invention provides a method for forming a semiconductor integrated circuit device, e.g., MOS, CMOS. The method includes providing a semiconductor substrate 501, e.g., silicon substrate, silicon on insulator, epitaxial silicon substrate. In a specific embodiment, the substrate includes an N-type well region. For a CMOS device, both N-type and P-type well regions are included. Field isolation oxide regions, including shallow trench isolation oxide 503, is provided between active regions on the substrate. Of course, there can be other variations, modifications, and alternatives.

In a specific embodiment, the method includes forming a dielectric layer (e.g., silicon dioxide, silicon nitride, silicon oxynitride) 505 overlying the semiconductor substrate. The method includes forming a gate layer (e.g., polysilicon) 507 overlying the dielectric layer. In a preferred embodiment, the gate layer is overlying a channel region 509 in the semiconductor substrate. The method includes forming a hard mask (e.g., silicon dioxide, silicon nitride) 511 overlying the gate layer. In a specific embodiment, the hard mask has a thickness of material having a thickness of about 200 to about 400 Angstroms, which is suitable for fabrication of devices having a channel length of 65 nanometers and less. The method includes patterning the gate layer, including the hard mask layer, to form a gate structure including edges, while a portion of the hard mask layer remains on the gate structure. Of course, there can be other variations, modifications, and alternatives.

Referring again to FIG. 5, the method includes forming a dielectric layer (e.g., conformal thickness) overlying the gate structure and hard mask layer to protect the gate structure including the edges. The dielectric layer can be an oxide, a nitride, or other suitable materials of sufficient thickness. The dielectric layer is also substantially pinhole free according to preferred embodiments. The dielectric layer is preferably less than 300 Angstroms in preferred embodiments. The method patterns the dielectric layer to form sidewall spacer structures 513 on the gate structure, including the edges, while the hard mask layer remains on the gate structure. The method etches a source region and a drain region adjacent to the gate structure using the dielectric layer and portion of the hard mask layer as a protective layer. Of course, there can be other variations, modifications, and alternatives.

In a specific embodiment, the method deposits silicon germanium material (e.g., epitaxial) 515 into the source region and the drain region to fill the etched source region and the etched drain region to cause a channel region between the source region and the drain region to be strained in compressive mode from at least the silicon germanium material formed in the source region and the drain region. The silicon germanium fill material is single crystalline and deposited using an epitaxial reactor. The ratio of silicon/germanium is 10% to 20% according to a specific embodiment. The etched source region and the etched drain region are each coupled to the gate structure. The device has a strained channel region between the filled source region and the filled drain region from at least the silicon germanium material formed in the etched source region and the etched drain region. The device also has lightly doped drain regions 518 or implant regions, which are formed before growing the silicon/germanium material in the recessed regions. Of course, there can be other variations, modifications, and alternatives.

In a preferred embodiment, the method forms a blanket layer 519 of material having an initial thickness overlying the source region, the drain region, and the gate structure to cover an upper surface of the gate structure, including the hard mask layer. In a specific embodiment, the blanket layer can be any suitable material to cover the surface region including the gate structure. The suitable material can be a polymer material, a photoresist material, a spin on glass, any combination of these, and the like. In a preferred embodiment, the blanket layer is a planarized polymeric material or spin-on-glass (SOG) coating or BARC (barrier antireflective coating) material. The blanket layer material is desirably compatible with the photo resist and has a comparable etch rate with hard mask material. In a specific embodiment, the blanket layer forms a substantially planarized surface region 521 from the blanket layer. Of course, there can be other variations, modifications, and alternatives.

In a specific embodiment, the method removes a portion 601 of the initial thickness of the blanket layer, as illustrated by FIG. 6. In a specific embodiment, the method uses an etch back process, a chemical mechanical polishing process, any combination of these, and others. In a preferred embodiment, the blanket layer is subjected to a plasma etch to remove the thickness of polymeric material evenly across the wafer and stop on top of the hard mask material. In a preferred embodiment, the hard mask is then removed either by plasma etch or/and wet etch to expose the poly silicon surface. In this preferred embodiment, the method completely removes the hard mask and expose 603 a portion of the gate structure. In a preferred embodiment, the portion of the gate structure is substantially polysilicon material. Of course, there can be a thin portion of the hard mask remaining in some embodiments. As shown, the hard mask is selectively removed without any damage to other portions of the MOS device according to a preferred embodiment of the present invention.

Referring to FIG. 7, the method forms a masking layer 701 overlying the planarized surface region in a specific embodiment. The masking layer can be any suitable material such as photo resist and/or other like materials according to a specific embodiment. The masking layer is patterned to form an exposed region 703 according to a specific embodiment. The exposed region is over the exposed gate structure, while can also include a portion of the sidewall spacer structures according to a specific embodiment. In a preferred embodiment, the resolution and alignment of the photo lithography does not have to be very high since the structure is generally self-aligned using the sidewall spacers and masking layer. In a specific embodiment, the method introduces dopant impurities 705 (e.g., N-type or P-type) into the portion of the gate structure using at least an implantation process to dope the gate structure, while maintaining the source region and the drain region free from the dopant impurities. Of course, there can be other variations, modifications, and alternatives.

In a specific embodiment, the masking layer is stripped. The blanket layer is selectively removed according to a specific embodiment. Depending upon the embodiment, a silicided material (e.g., titanium, tungsten, cobalt, nickel, platinum, and others) can be provided overlying the polysilicon gate structure. In a preferred embodiment, the silicided material is provided after the blanket layer has been selectively removed. Of course, there can be other variations, modifications, and alternatives.

Although the above has been described in terms of an MOS device, there can be other variations, modifications, and alternatives. For CMOS devices, one or two additional masks are included to have selected polysilicon gate structures exposed for a particular doping of each of the types of transistors, including NMOS and PMOS devices. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor integrated circuit device comprising:
    providing a semiconductor substrate;
    forming a dielectric layer overlying the semiconductor substrate;
    forming a polysilicon gate layer overlying the dielectric layer, the polysilicon gate layer being overlying a channel region in the semiconductor substrate;
    forming a hard mask layer overlying the polysilicon gate layer;
    patterning the polysilicon gate layer, including the hard mask layer, to form a gate structure including edges;
    forming a dielectric layer overlying the gate structure and hard mask layer to protect the gate structure including the edges;
    patterning the dielectric layer to form sidewall spacer structures on the gate structure, including the edges, and exposing a portion of the hard mask layer;
    etching a source region and a drain region adjacent to the gate structure using the sidewall spacer structures, and said portion of the hard mask layer and sidewall spacer structures are used as a protective structure for the gate layer;
    depositing silicon germanium fill material into the source region and the drain region to fill the etched source region and the etched drain region while causing a channel region between the source region and the drain region to be strained in compressive mode from at least the silicon germanium material formed in the source region and the drain region;
    forming a blanket layer of material having an initial thickness overlying the source region, the drain region, and the gate structure to cover an upper surface of the gate structure, including the hard mask layer, to form a substantially planarized surface region from the blanket layer;
    removing a portion of the initial thickness of the blanket layer to remove the hard mask layer and expose a portion of the gate layer; and
    introducing dopant impurities into the portion of the gate layer using at least an implantation process to dope the gate layer, while maintaining the source region and the drain region free from the dopant impurities.

2. The method of claim 1 wherein the dielectric layer is less than 300 Angstroms.

3. The method of claim 1 wherein the channel region has a length of a width of the gate structure.

4. The method of claim 1 wherein the semiconductor substrate is essential silicon material.

5. The method of claim 1 wherein the silicon germanium material is single crystalline.

6. The method of claim 1 wherein the silicon germanium has a ratio of silicon/germanium of 10% to 20%.

7. The method of claim 1 wherein the introducing dopant impurities comprises masking and exposing the portion of the gate layer.

8. The method of claim 1 wherein the hard mask layer is a material having a thickness of about 200 to about 400 Angstroms.

9. The method of claim 1 wherein the depositing is provided using an epitaxial reactor.

10. The method of claim 1 wherein the compressive mode increases a mobility of holes in the channel region.

11. The method of claim 1 wherein the blanket layer is selected from a polymer layer or a spin on glass layer.

12. The method of claim 1 wherein the blanket layer comprises a spin on glass layer.

13. The method of claim 1 wherein the blanket layer comprises a polymeric coating material.

14. The method of claim 1 further comprising removing substantially all of the blanket material.

15. The method of claim 1 wherein the introducing of the dopant is self aligned.

16. The method of claim 1 wherein the removing comprises an etch back process or a chemical mechanical polishing process.

17. A method for forming a semiconductor integrated circuit device comprising:

providing a semiconductor substrate;

forming a dielectric layer overlying the semiconductor substrate;

forming a gate layer overlying the dielectric layer, the gate layer being overlying a channel region in the semiconductor substrate;

forming a hard mask layer overlying the gate layer;

patterning the gate layer, including the hard mask layer, to form a gate structure including edges, while the hard mask layer remains on the gate layer;

forming a dielectric layer overlying the gate structure and hard mask layer to protect the gate structure including the edges;

patterning the dielectric layer to form sidewall spacer structures on the gate structure, including the edges, while the hard mask layer remains on the gate structure;

etching a source region and a drain region adjacent to the gate structure using the sidewall spacer structures, and said portion of the hard mask layer and the sidewall spacer structures are used as a protective structure for the gate layer;

depositing silicon germanium material into the source region and the drain region to fill the etched source region and the etched drain region to cause a channel region between the source region and the drain region to be strained in compressive mode from at least the silicon germanium material formed in the source region and the drain region;

forming a blanket layer of material having an initial thickness overlying the source region, the drain region, and the gate structure to cover an upper surface of the gate structure, including the hard mask layer, to form a substantially planarized surface region from the blanket layer;

removing a portion of the initial thickness of the blanket layer to remove the hard mask layer and expose a portion of the gate layer; and introducing dopant impurities into the portion of the gate layer using at least an implantation process to dope the gate layer, while maintaining the source region and the drain region free from the dopant impurities.

18. The method of claim 17 wherein the removing comprises an etch back process or a chemical mechanical polishing process.

19. The method of claim 17 wherein the blanket layer comprises a polymeric material.

20. The method of claim 17 wherein the blanket layer comprises a spin on glass material.

* * * * *